United States Patent
Mazoyer et al.

(10) Patent No.: US 10,607,949 B2
(45) Date of Patent: Mar. 31, 2020

(54) ELECTROSTATIC DISCHARGE (ESD) PROTECTION FOR A HIGH SIDE DRIVER CIRCUIT

(71) Applicants: STMicroelectronics (Alps) SAS, Grenoble (FR); STMicroelectronics SA, Montrouge (FR)

(72) Inventors: Yves Mazoyer, Meylan (FR); Philippe Galy, Le Touvet (FR); Philippe Sirito-Olivier, St. Egreve (FR)

(73) Assignees: STMicroelectronics (Alps) SAS, Grenoble (FR); STMicroelectronics SA, Montrouge (FR)

(*) Notice: Subject to any disclaimer, the term of this patent is extended or adjusted under 35 U.S.C. 154(b) by 374 days.

(21) Appl. No.: 15/607,780

(22) Filed: May 30, 2017

(65) Prior Publication Data
US 2018/0351353 A1 Dec. 6, 2018

(51) Int. Cl.
*H01L 23/60* (2006.01)
*H01L 23/62* (2006.01)
*H01L 27/02* (2006.01)

(52) U.S. Cl.
CPC .............. *H01L 23/60* (2013.01); *H01L 23/62* (2013.01); *H01L 27/0255* (2013.01); *H01L 27/0288* (2013.01)

(58) Field of Classification Search
CPC ..... H01L 23/60; H01L 23/62; H01L 27/0255; H01L 27/0288
See application file for complete search history.

(56) References Cited

U.S. PATENT DOCUMENTS

| | | | | |
|---|---|---|---|---|
| 5,500,619 | A * | 3/1996 | Miyasaka | H03K 17/08128 327/427 |
| 5,631,494 | A * | 5/1997 | Sakurai | H01L 27/0248 257/139 |
| 8,619,397 | B2 * | 12/2013 | Mikolajczak | H02H 9/046 361/56 |
| 9,159,719 | B2 * | 10/2015 | Mayerhofer | H01L 27/0255 |
| 2007/0159751 | A1 * | 7/2007 | Hussein | H01L 27/0255 361/100 |
| 2010/0059028 | A1 * | 3/2010 | Ueno | F02P 3/051 123/652 |
| 2011/0194220 | A1 | 8/2011 | Duvvury et al. | |
| 2015/0084533 | A1 * | 3/2015 | Naito | H01L 29/7395 315/209 T |
| 2016/0013638 | A1 | 1/2016 | Glas et al. | |

FOREIGN PATENT DOCUMENTS

DE 112013004262 T5 6/2015

OTHER PUBLICATIONS

Search Report from co-pending DE Appl. No. 102018122509.7 dated Nov. 26, 2018 (9 pages).

* cited by examiner

*Primary Examiner* — Scott Bauer
(74) *Attorney, Agent, or Firm* — Crowe & Dunlevy

(57) ABSTRACT

Electrostatic discharge (ESD) protection is provided by a circuit including a resistor having a first terminal and a second terminal, a zener diode having a cathode terminal directly connected to said first terminal and an anode terminal directly connected to a third terminal, and a clamp diode having a cathode terminal directly connected to said second terminal and an anode terminal directly connected to said third terminal.

31 Claims, 2 Drawing Sheets

ELECTROSTATIC DISCHARGE (ESD) PROTECTION FOR A HIGH SIDE DRIVER CIRCUIT

TECHNICAL FIELD

The present invention relates to protecting an integrated circuit against overvoltages and, in particular, against electrostatic discharges.

BACKGROUND

There are a number of electrostatic discharge (ESD) classification levels with respect to the integrated circuit Charged Device Model (CDM) requirements. One such component classification level is referred to as the "C4B" level which requires that the integrated circuit withstand three times a zap stress of ±500V at the integrated circuit pins other than at corners of the package, and withstand three times a zap stress of ±750V at the integrated circuit corner pins. This is a very difficult test for certain components of an integrated circuit to pass. For example, it has proven especially difficult for a high side driver circuit to withstand an ESD stress and meet the C4B certification.

There is a need in the art for an improved ESD protection for a high side driver circuit.

SUMMARY

In an embodiment, a circuit comprises: a power MOSFET device having a gate terminal, a source terminal and a drain terminal; a sense MOSFET device having a gate terminal, a source terminal and a drain terminal; a resistor having a first terminal coupled to the gate terminal of the power MOSFET device and a second terminal coupled to the gate terminal of the sense MOSFET device; a zener diode having an anode terminal coupled to the source terminal of the sense MOSFET device and a cathode terminal coupled to the gate terminal of the sense MOSFET device; and a clamp diode having an anode terminal coupled to the source terminal of the sense MOSFET device and a cathode terminal coupled to the gate terminal of the power MOSFET device.

In an embodiment, a circuit comprises: a power MOSFET device having a gate terminal, a source terminal and a drain terminal; a sense MOSFET device having a gate terminal, a source terminal and drain terminal; a resistor having a first terminal directly connected to the gate terminal of the power MOSFET device and a second terminal directly connected to the gate terminal of the sense MOSFET device; a zener diode having an anode terminal directly connected to the source terminal of the sense MOSFET device and a cathode terminal directly connected to the gate terminal of the sense MOSFET device; and a clamp diode having an anode terminal directly connected to the source terminal of the sense MOSFET device and a cathode terminal directly connected to the gate terminal of the power MOSFET device.

In an embodiment, a circuit comprises: a resistor having a first terminal and a second terminal; a zener diode having a cathode terminal directly connected to said first terminal and an anode terminal directly connected to a third terminal; and a clamp diode having a cathode terminal directly connected to said second terminal and an anode terminal directly connected to said third terminal.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
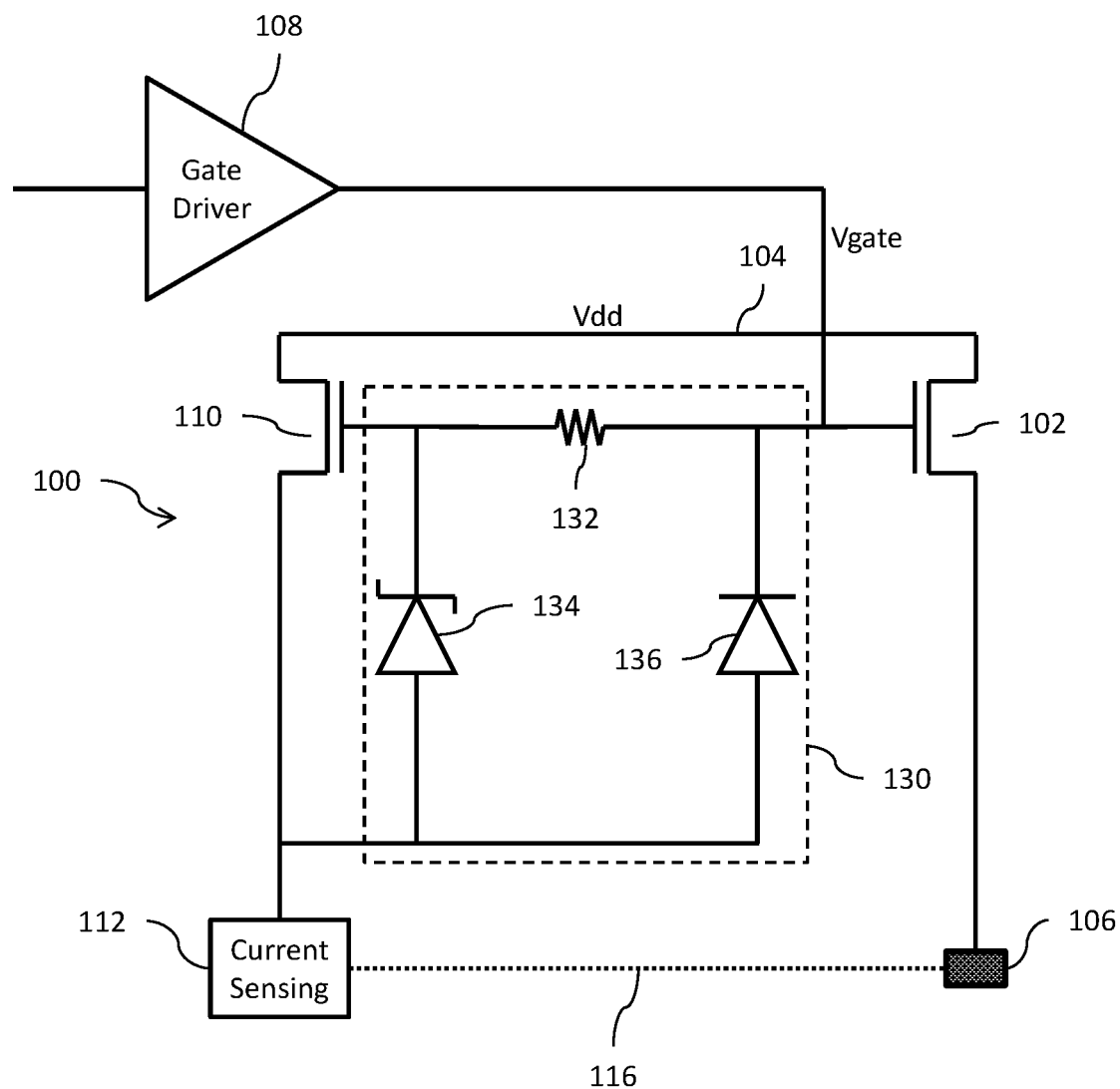
FIG. 1 shows a circuit diagram for a high side driver circuit with electrostatic discharge (ESD) protection.

Reference is now made to FIG. 1 showing a circuit diagram for a high side driver circuit 100 with electrostatic discharge (ESD) protection. The high side driver circuit 100 includes a power n-channel MOSFET device 102 having a drain terminal coupled to a power supply node (Vdd) 104 and a source terminal coupled to an output pad 106. A gate terminal of the high side driver circuit 100 is driven by a signal output (Vgate) by a gate driver 108. A sense n-channel MOSFET device 110 has a drain terminal coupled to the power supply node (Vdd) 104 and a source terminal coupled to a current sensing circuit 112. The gate terminal of the sense n-channel MOSFET device 110 is indirectly connected to the gate terminal of the power n-channel MOSFET device 102. In steady-state operation, this configuration forms a current mirroring circuit where a fractional replica of the current flowing through the power n-channel MOSFET device 102 in response to the signal output by a gate driver 108 is passed by the sense n-channel MOSFET device 110 to the current sensing circuit 112. The fraction is determined by the size ratio of the sense n-channel MOSFET device 110 to the power n-channel MOSFET device 102 (for example, 1/1000).

An ESD protection circuit 130 protects the sense n-channel MOSFET device 110 from damage in response to an ESD event at the output pad 106 or an overstress event (electrical overstress (EOS)). In this context, the source of the sense n-channel MOSFET device 110 and the current sensing circuit 112 are coupled to the output pad 106 through an electrostatic path during the ESD charged device model (CDM) stress. The electrostatic path is the lowest resistive path used by pre-loaded charges in the integrated circuit during the ESD CDM sequence to flow out of the integrated circuit when pad 106 is connected to ground. This electrostatic path is mainly metal conductor lines (of low resistance), and is in series the metal lines from the gate driver 108 output (Vgate node) to the gates of transistors 102 and 110, and metal lines from the source of transistor 110 to the current sensing circuit 112 and metal lines from node 116 to pad 106. The electrostatic path may, for example, be viewed as a charge collector.

The ESD protection circuit 130 includes a resistor 132 having a first terminal coupled to the gate of the power n-channel MOSFET device 102 and a second terminal coupled to the gate of the sense n-channel MOSFET device 110. The resistor 132 may, for example, have a resistance in a range of 10-2000 Ohms, and more specifically may have a resistance of 200 Ohms. The serial connection of the resistor 132 between the gates of the MOSFET devices 102 and 110 serves to limit peak current flowing from the gate of the power n-channel MOSFET device 102 to the gate of the sense n-channel MOSFET device 110. The circuit 130 further includes a Zener diode 134 having an anode terminal coupled to the source terminal of the sense n-channel MOSFET device 110 and a cathode terminal coupled to the gate terminal of the sense n-channel MOSFET device 110 (i.e., to the second terminal of resistor 132). The Zener diode 134 may, for example, have a breakdown voltage of about 5V, and is integrated with a minimum size as permitted by the integrated circuit process technology used to fabricate the circuit 130 in order to assure a fast turn on in response to a transient event. The circuit 130 still further includes a substrate diode 136 having an anode terminal coupled to the source terminal of the sense n-channel MOSFET device 110 and a cathode terminal coupled to the gate terminal of the sense n-channel MOSFET device 110 (i.e., to the second terminal of resistor 132). The substrate diode 136 functions as a clamping device and may, for example, have a clamp voltage of about 20V.

In designing the high side driver circuit 100 with the ESD protection circuit 130, it is important for the circuit layout to place the Zener diode 134 close to the sense n-channel MOSFET device 110 and its gate-to-source that is being protected. The resistor 132 may be implemented as a metallic line connecting the gate of the power n-channel MOSFET device 102 to the gate of the sense n-channel MOSFET device 110 with a length (or other dimension) sufficient to produce the desired resistance value.

When an ESD transient event occurs (for example, from Vgate to pad 106), the Zener diode 134 has a fast turn-on reaction time to provide a derivative path for these electrostatic charges (flowing down to the output pad 106 through the path 116) and thus protects the MOSFET device 110. The resistor 132 limits the peak current of this derivative path (including the path in the Zener diode 134). The substrate diode 136 has a slower turn-on (in comparison to the Zener diode 134) and it limits with a short delay the overvoltage to protect both devices 110 and 134. The overvoltage here is the voltage drop across the Zener 134 plus the voltage drop across the resistor 132. This protection voltage may, for example, be around 18-20V. The substrate diode 136 provides a second derivative path for some of the electrostatic charges (flowing down to the output pad 106 through the path 116).

The current sensing circuit 112 functions to provide a good current ratio accuracy between the copy transistor 110 and the output transistor 102. The circuit operates by controlling voltage at the source of transistor 110 to equal the voltage at the source of transistor 102. The voltage potential of Vgate is equal for both transistors 102 and 110. Then, the gate-to-source voltage of transistor 110 will equal the gate-to-source voltage of transistor 102 with current ratio then equal the size (W/L) ratio of the two transistors. Circuits of this type are known in the art.

Figure 2:
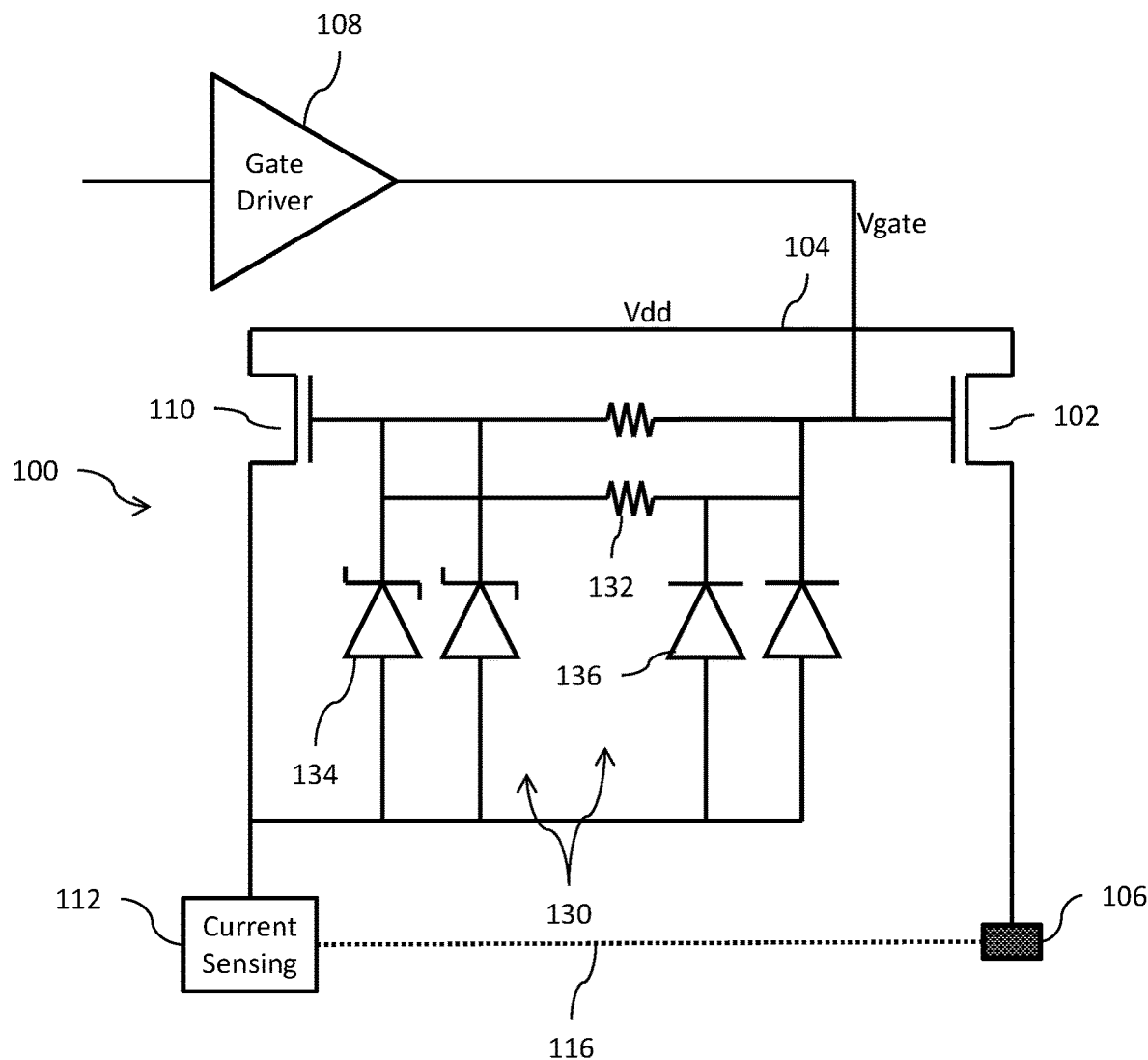
FIG. 2 shows a circuit diagram for a high side driver circuit with ESD protection.

Reference is now made to FIG. 2 showing a circuit diagram for a high side driver circuit 100 with electrostatic discharge (ESD) protection. Like reference numbers refer to like or similar components which will not be described again. The circuit of FIG. 2 differs from the circuit of FIG. 1 in that the ESD protection circuit 130 has been replicated two times, with the circuits 130 connected in parallel with each other between the gates of the MOSFET devices 102 and 110. Although a replication of two times is shown, it will be understood that the circuit 130 could be replicated n times, as desired, where n is an integer value greater than 1. The more times the circuit 130 is replicated, the greater the current carrying capacity due to the increased area occupied by the Zener diodes.

To ensure a best efficiency during ESD CDM stress (i.e., a fast turn on), the Zener diode 134 must have a layout at a minimum Design Rule Manual (DRM) allowed area size of the technology node for the fabrication. In a preferred implementation, the Zener diode 134 would have a square form with four contacts. In addition, the Zener diode 134 should be placed in the layout as close as possible to transistor 110 to ensure protection. The resistance between the transistors 102 and 110 must be as low as possible on the metal of the gate and source sides.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A circuit, comprising:
   a power MOSFET device having a gate terminal, a source terminal and a drain terminal;
   a sense MOSFET device having a gate terminal, a source terminal and drain terminal;
   a resistor having a first terminal coupled to the gate terminal of the power MOSFET device and a second terminal coupled to the gate terminal of the sense MOSFET device;
   a zener diode having an anode terminal coupled to the source terminal of the sense MOSFET device and a cathode terminal coupled to the gate terminal of the sense MOSFET device; and
   a clamp diode having an anode terminal coupled to the source terminal of the sense MOSFET device and a cathode terminal coupled to the gate terminal of the power MOSFET device;
   wherein a breakdown voltage of the zener diode is less than a clamping voltage of the clamp diode.

2. The circuit of claim 1, wherein the drain terminals of the power MOSFET device and sense MOSFET device are coupled to a power supply node.

3. The circuit of claim 1, wherein the source terminal of the power MOSFET device is coupled to an integrated circuit pad.

4. The circuit of claim 1, wherein the resistor comprises a resistance of a metal line between the gate terminal of the power MOSFET device and the gate terminal of the sense MOSFET device.

5. The circuit of claim 1, further comprising a drive circuit outputting a drive signal applied to the gate terminal of the power MOSFET device.

6. A circuit, comprising:
   a power MOSFET device having a gate terminal, a source terminal and a drain terminal;
   a sense MOSFET device having a gate terminal, a source terminal and drain terminal;
   a resistor having a first terminal directly connected to the gate terminal of the power MOSFET device and a second terminal directly connected to the gate terminal of the sense MOSFET device;
   a zener diode having an anode terminal directly connected to the source terminal of the sense MOSFET device and a cathode terminal directly connected to the gate terminal of the sense MOSFET device; and
   a clamp diode having an anode terminal directly connected to the source terminal of the sense MOSFET device and a cathode terminal directly connected to the gate terminal of the power MOSFET device.

7. The circuit of claim 6, wherein the drain terminals of the power MOSFET device and sense MOSFET device are directly connected to a power supply node.

8. The circuit of claim 6, wherein the source terminal of the power MOSFET device is directly connected to an integrated circuit pad.

9. The circuit of claim 6, wherein the resistor comprises a resistance of a metal line between the gate terminal of the power MOSFET device and the gate terminal of the sense MOSFET device.

10. The circuit of claim 6, wherein a breakdown voltage of the zener diode is less than a clamping voltage of the clamp diode.

11. The circuit of claim 6, wherein a turn on time of the zener diode is less than a turn on time of the clamp diode.

12. The circuit of claim 6, further comprising a drive circuit outputting a drive signal applied to the gate terminal of the power MOSFET device.

13. The circuit of claim 6, further comprising:
 a further resistor having a first terminal directly connected to the gate terminal of the power MOSFET device and a second terminal directly connected to the gate terminal of the sense MOSFET device;
 a further zener diode having an anode terminal directly connected to the source terminal of the sense MOSFET device and a cathode terminal directly connected to the gate terminal of the sense MOSFET device; and
 a further clamp diode having an anode terminal directly connected to the source terminal of the sense MOSFET device and a cathode terminal directly connected to the gate terminal of the power MOSFET device.

14. A circuit, comprising:
 a resistor having a first terminal and a second terminal;
 a zener diode having a cathode terminal directly connected to said first terminal and an anode terminal directly connected to a third terminal; and
 a clamp diode having a cathode terminal directly connected to said second terminal and an anode terminal directly connected to said third terminal;
 wherein a breakdown voltage of the zener diode is less than a clamping voltage of the clamp diode.

15. The circuit of claim 14, wherein the resistor comprises a resistance of a metal line between the first and second terminals.

16. A circuit, comprising:
 a power MOSFET device having a gate terminal, a source terminal and a drain terminal;
 a sense MOSFET device having a gate terminal, a source terminal and drain terminal;
 a resistor having a first terminal coupled to the gate terminal of the power MOSFET device and a second terminal coupled to the gate terminal of the sense MOSFET device;
 a zener diode having an anode terminal coupled to the source terminal of the sense MOSFET device and a cathode terminal coupled to the gate terminal of the sense MOSFET device; and
 a clamp diode having an anode terminal coupled to the source terminal of the sense MOSFET device and a cathode terminal coupled to the gate terminal of the power MOSFET device;
 wherein a turn on time of the zener diode is less than a turn on time of the clamp diode.

17. The circuit of claim 16, wherein the drain terminals of the power MOSFET device and sense MOSFET device are coupled to a power supply node.

18. The circuit of claim 16, wherein the source terminal of the power MOSFET device is coupled to an integrated circuit pad.

19. The circuit of claim 16, wherein the resistor comprises a resistance of a metal line between the gate terminal of the power MOSFET device and the gate terminal of the sense MOSFET device.

20. The circuit of claim 16, further comprising a drive circuit outputting a drive signal applied to the gate terminal of the power MOSFET device.

21. A circuit, comprising:
 a power MOSFET device having a gate terminal, a source terminal and a drain terminal;
 a sense MOSFET device having a gate terminal, a source terminal and drain terminal;
 a resistor having a first terminal coupled to the gate terminal of the power MOSFET device and a second terminal coupled to the gate terminal of the sense MOSFET device;
 a zener diode having an anode terminal coupled to the source terminal of the sense MOSFET device and a cathode terminal coupled to the gate terminal of the sense MOSFET device;
 a clamp diode having an anode terminal coupled to the source terminal of the sense MOSFET device and a cathode terminal coupled to the gate terminal of the power MOSFET device;
 a further resistor having a first terminal coupled to the gate terminal of the power MOSFET device and a second terminal coupled to the gate terminal of the sense MOSFET device;
 a further zener diode having an anode terminal coupled to the source terminal of the sense MOSFET device and a cathode terminal coupled to the gate terminal of the sense MOSFET device; and
 a further clamp diode having an anode terminal coupled to the source terminal of the sense MOSFET device and a cathode terminal coupled to the gate terminal of the power MOSFET device.

22. The circuit of claim 21, wherein the drain terminals of the power MOSFET device and sense MOSFET device are coupled to a power supply node.

23. The circuit of claim 21, wherein the source terminal of the power MOSFET device is coupled to an integrated circuit pad.

24. The circuit of claim 21, wherein the resistor comprises a resistance of a metal line between the gate terminal of the power MOSFET device and the gate terminal of the sense MOSFET device.

25. The circuit of claim 21, wherein a breakdown voltage of the zener diode is less than a clamping voltage of the clamp diode.

26. The circuit of claim 21, wherein a turn on time of the zener diode is less than a turn on time of the clamp diode.

27. The circuit of claim 21, further comprising a drive circuit outputting a drive signal applied to the gate terminal of the power MO SFET device.

28. A circuit, comprising:
 a resistor having a first terminal and a second terminal;
 a zener diode having a cathode terminal directly connected to said first terminal and an anode terminal directly connected to a third terminal; and
 a clamp diode having a cathode terminal directly connected to said second terminal and an anode terminal directly connected to said third terminal;
 wherein a turn on time of the zener diode is less than a turn on time of the clamp diode.

29. The circuit of claim 28, wherein the resistor comprises a resistance of a metal line between the first and second terminals.

30. A circuit, comprising:
 a resistor having a first terminal and a second terminal;

a zener diode having a cathode terminal directly connected to said first terminal and an anode terminal directly connected to a third terminal;

a clamp diode having a cathode terminal directly connected to said second terminal and an anode terminal directly connected to said third terminal;

a further resistor having a fourth terminal directly connected to said first terminal and a fifth terminal directly connected to said second terminal;

a further zener diode having a cathode terminal directly connected to said first terminal and an anode terminal directly connected to the third terminal; and a further clamp diode having a cathode terminal directly connected to said second terminal and an anode terminal directly connected to the third terminal.

31. The circuit of claim 30, wherein the resistor comprises a resistance of a metal line between the first and second terminals.

\* \* \* \* \*